United States Patent [19]
Chu

[11] Patent Number: 5,408,234
[45] Date of Patent: Apr. 18, 1995

[54] MULTI-CODEBOOK CODING PROCESS

[75] Inventor: Ke-Chiang Chu, Saratoga, Calif.

[73] Assignee: Apple Computer, Inc., Cupertino, Calif.

[21] Appl. No.: 56,343

[22] Filed: Apr. 30, 1993

[51] Int. Cl.$^6$ ............................................... H03M 7/42
[52] U.S. Cl. ....................................... 341/106; 341/51
[58] Field of Search ............................ 341/106, 51, 50

[56] References Cited

U.S. PATENT DOCUMENTS

| | | |
|---|---|---|
| 3,860,908 | 1/1975 | Stratton, III . |
| 4,588,302 | 12/1985 | Welch . |
| 4,628,297 | 12/1986 | Mita et al. . |
| 4,804,959 | 2/1989 | Makansi et al. . |

OTHER PUBLICATIONS

IEEE, Computer, Jun. 1984, pp. 8–19, Terry A. Welch, Sperry Research Center, "A Technique for High-Performance Data Compression."
IEEE, Transactions On Information Theory, vol. II 23, No. 3, May 1977, pp. 337–343 J. Ziv, A. Lempel, "A Universal Algorithm for Sequential Data Compression."
IEEE, Transactions On Information Theory, vol. II 24, No. 5, Sep. 1978, pp. 530–536, J. Ziv, A. Lempel, "Compression of Individual Sequences via Variable--Rate Coding."
IEEE Transactions on Information Theory vol. II, 21, No. 2, Mar. 1975, pp. 194–203. Peter Elias, "Universal Codeword Sets and Representations of the Integers."
Communications of the ACM, Apr. 1989 vol. 32 No. 4, pp. 490–504, Edward R. Riala and Daniel H. Greene, "Data Compression with Finite Windows."
Timothy C. Bell, John G. Cleary, Ian H. Witten, *Text Compression*, Prentice Hall, Englewood Cliffs, N.J., 1990, pp. 206–243.

*Primary Examiner*—Sharon D. Logan
*Attorney, Agent, or Firm*—V. Randall Gard

[57] ABSTRACT

An improved multi-codebook phase-in coding process for coding electronic data wherein for each received electronic input data, the coding process detects whether that input data exceeds a current coding maximum, then selecting a codebook coding method from one or more codebook coding methods in response to detecting whether that input data exceeds the current coding maximum, and then encoding that input data in accordance to the selected codebook coding method to generate a coded output data. A corresponding codebook indicator is inserted into a generated coded output data stream to indicate which codebook method to use to decode the coded output data. During decoding, the decoding process detects for a decode method indicator associated with each encoded input data, and decodes in accordance to a decode method corresponding to the detected decode method indicator to generate a decoded output data.

18 Claims, 6 Drawing Sheets

MULTI-CODEBOOK CODING PROCESS

FIELD OF INVENTION

This invention relates to electronic data manipulation processes. More specifically, this invention relates to electronic data compression processes.

BACKGROUND

FIG. 1 illustrates a typical LZ data compression method. The LZ compression method of FIG. 1 processes an input data stream 10 to generate a compressed data output stream 20 by comparing an uncompressed portion 13 of input data stream 10 to data in a history buffer 11 of already processed input data. If a data string 12 is located in history buffer 11 which matches current data string 14, data string 14 is then encoded in compressed data stream 20 as a codeword $(p_o, l_o)$ 24, corresponding to an offset $p_o$ 15 and a data length $l_o$ 16. The shorter length of data, such as codeword $(p_o, l_o)$ 24 thus replaces longer data string 14 in output compressed data stream 20.

Offset $p_o$ 15 is typically a random number that fails within a known range of values determined by the length of history buffer 11. Although the actual value of offset 15 often happens to be a small value, offset 15 also has an upper maximum in that known range of values that increases as the length of history buffer 11 increases. Encoding a variable, such as offset 15, using a single codebook coding method is well known. Typical single fixed length codebook coding method represents offset 15 using a fixed length codeword. A n-bit fixed length codebook codes $2^n$ source data, encoding decimal equivalents from 0 to $(2^n-1)$ with fixed n number of bits per codeword.

FIG. 2 illustrates two fixed length codebooks, a 3-bit fixed length codebook 30 and a 4-bit fixed length codebook 40. A 3-bit fixed length codebook encodes up to $2^3$ or 8 source data, encoding data from 0 to 7 with 3 bits per codeword. The coding range maximum for a 3-bit fixed codebook is therefore equivalent to the decimal numeral 7. A 4-bit fixed length codebook provides a larger codebook than a 3-bit fixed length codebook, since a 4-bit codebook codes $2^4$ or 16 source data, providing a coding range from 0-15. It would be desirable to select a small single fixed length codebook to encode offset 15, which is often a small value. However, since the upper range of offset 15 is constantly increasing to correspond to the constantly increasing length of history buffer 11 as the data compression progresses, the single fixed length codebook selected at the outset of data compression should be sufficiently large to encode the maximum possible value of offset 15. Selecting such a large single fixed length codebook is inefficient when the typical offset value is often a small value, and using an unnecessarily large codebook therefore undesirably increases the number of bits per codeword to be stored, thereby also increasing the memory requirements for the stored data.

FIG. 3 illustrates an example of a 3-bit variable length single codebook coding method. As shown in FIG. 3, a 3-bit variable single codebook has a coding range maximum of 4, encoding data from 0 to 4. The codeword format increases from a 2 bit per codeword representation to a 3 bit per codeword representation in one codebook. The variable length codebook allows coding of offset values from 0 to 2 with only two bits, rather than the 3 bits per codeword of a 3-bit fixed codebook, while still allowing coding of data value 3 and 4 in the same codebook when needed. Thus, a variable length codebook provides efficient coding for a variable with recurring smaller values, while increasing the upper maximum range of the codeword representation to allow encoding of a larger value within the upper maximum range when that value occurs. However, like the single fixed length variable codebook approach, a single variable length codebook approach is also inflexible as it would require that the codebook selected at the outset of data compression to be sufficiently large to accommodate the maximum possible offset value corresponding to the growing maximum length of history buffer 11 over time.

In the multiple codebooks phase-in coding method, a set of codebooks of variable lengths is provided. As the coding range maximum of offset 15 increases past the maximum coding range of a particular codebook in that set of provided codebooks, the next larger codebook is then automatically selected, or "phased-in," to encode the next offset value. This approach ensures that if a large offset value occurs, then the newly selected codebook will be able to handle that larger offset value.

The traditional multiple codebooks phase-in coding method is however still not very efficient, since offset 15 is often still a small value even if its maximum possible value may have increased with the increasing length of the history buffer over time. Thus, automatically phasing-in the next larger codebook in response to the current possible maximum value of offset 15, unnecessarily increases the length of the codeword, when the actual value of offset 15 can still be represented by the prior smaller codebook used. Since a significant mount of data is continuously transmitted and stored by the computer during its operation, the effect of reducing a data representation even by one bit per codeword is significant when this data bit reduction is multiplied by the mount of data to be coded to produce a significant, highly sought after, memory saving result. It is therefore desirable to provide an efficient data coding system which minimizes the number of bits required to represent a random variable, such as offset 15 that has an upper maximum that increases over time.

SUMMARY OF THE INVENTION

An improved multi-codebook coding process for coding electronic data received by a computer system is provided. The coding process comprises detecting if that input data exceeds a current coding maximum selected from a set of coding maximums, with the set of coding maximums prioritized from the smallest coding maximum to the largest coding maximum. The coding process selects a codebook from a set of codebooks in response to the step of detecting if the input data is greater than the current coding maximum, and then encoding that input data in accordance to the selected codebook to generate a coded output data.

In a decoding process, the decoding process comprises receiving one or more electronic encoded input data and, for each encoded input data, the decoding process detects whether one or more decode method indicators are associated with that encoded input data. The decoding process then selects a codebook for decoding from a set of codebooks in response to whether one or more decode method indicators are detected, the set of codebooks prioritized from the smallest codebook to the largest codebook. The decoding process then decodes that encoded input data in accordance to the selected codebook to generate a decoded output data.

The coding process described in accordance with the principles of this invention accommodates multiple codebooks having differing coding ranges. It is thus an objective of this invention to maximize the data compression of a computer system by minimizing the number of bits to represent each input data by using a smaller codebook where the input data to be coded is detected to be within the coding range of the smaller codebook. A larger codebook is "phased-in" only where the input data to be coded exceeds the coding range of a smaller codebook.

BRIEF DESCRIPTION OF DRAWINGS

FIG. 2 illustrates an example of a 3-bit variable length codebook;

DETAILED DESCRIPTION

Figures 1, 2, 3:
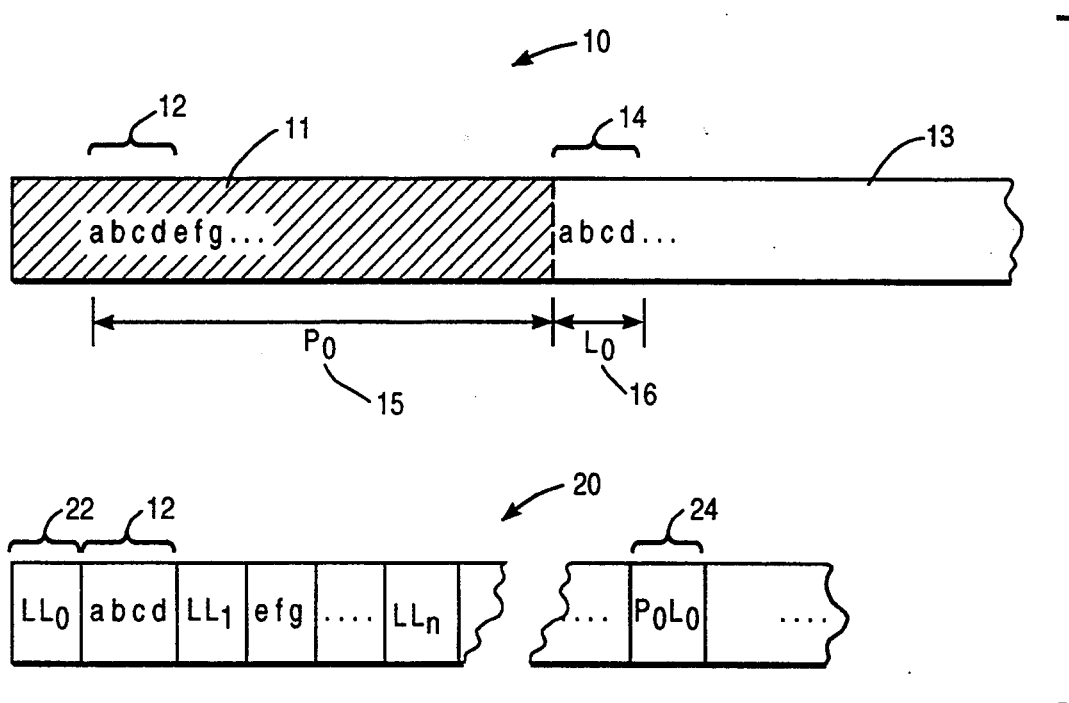
Fig. 1 illustrates an example of a typical compression scheme using Ziv-Lempel coding approach.
FIG. 2 illustrates an example of a 3-bit fixed length codebook and a 4-bit fixed length codebook.
Figure 4:
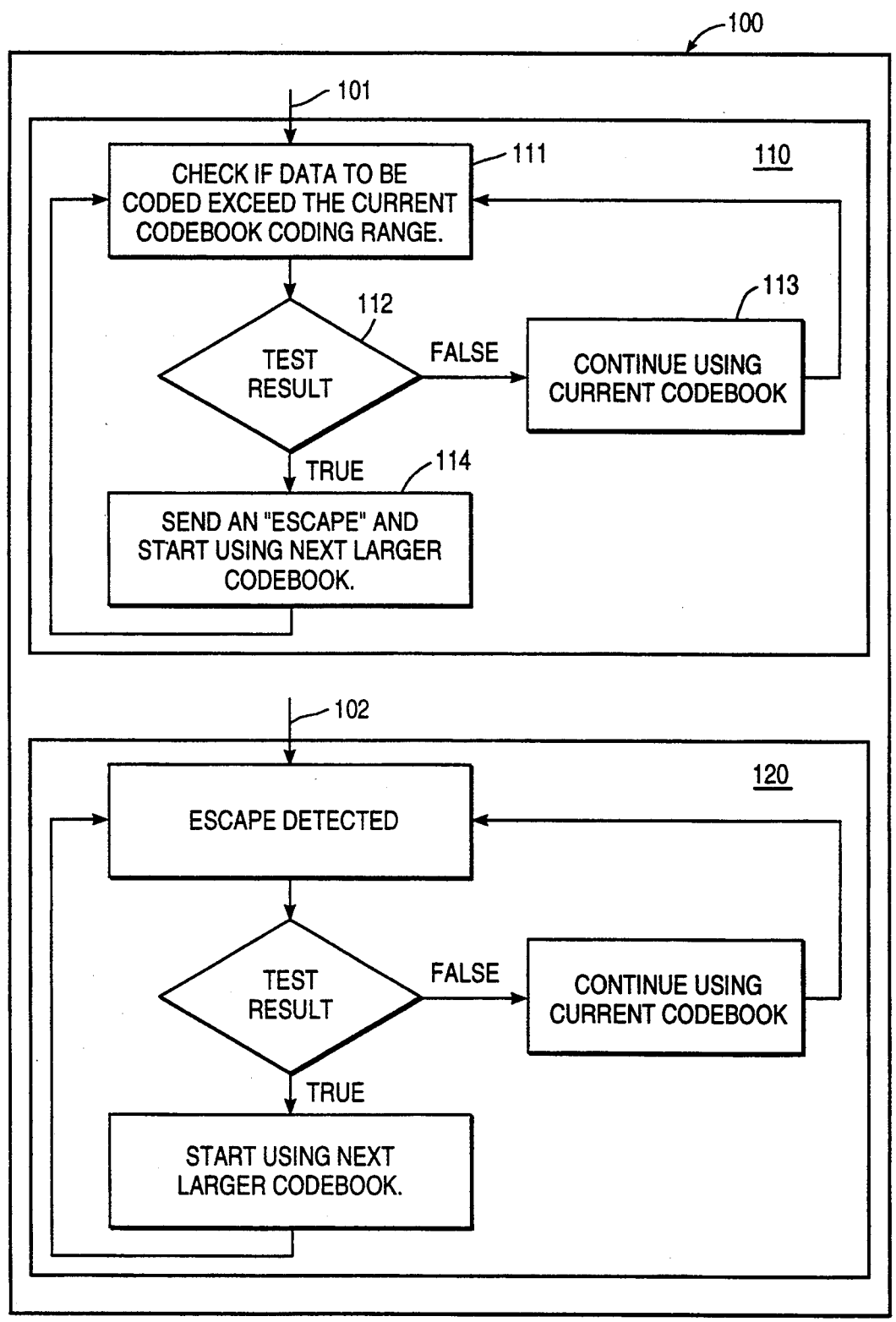
FIG. 4 illustrates a block diagram of an improved multicodebook coding process provided in accordance with the principles of this invention.

FIG. 4 illustrates an example of an improved multicodebook coding process constructed in accordance with the principles of this invention. Multi-codebook coding process 100 comprises a coding process 110 for encoding input data stream 101 and a decoding process 120 for decoding coded data stream 102. To code data X, coding process 110 receives an input data stream 10 1 and code input data stream 101 in defined block units. The size of each block unit can be defined according to the user's application and need.

Figure 5:
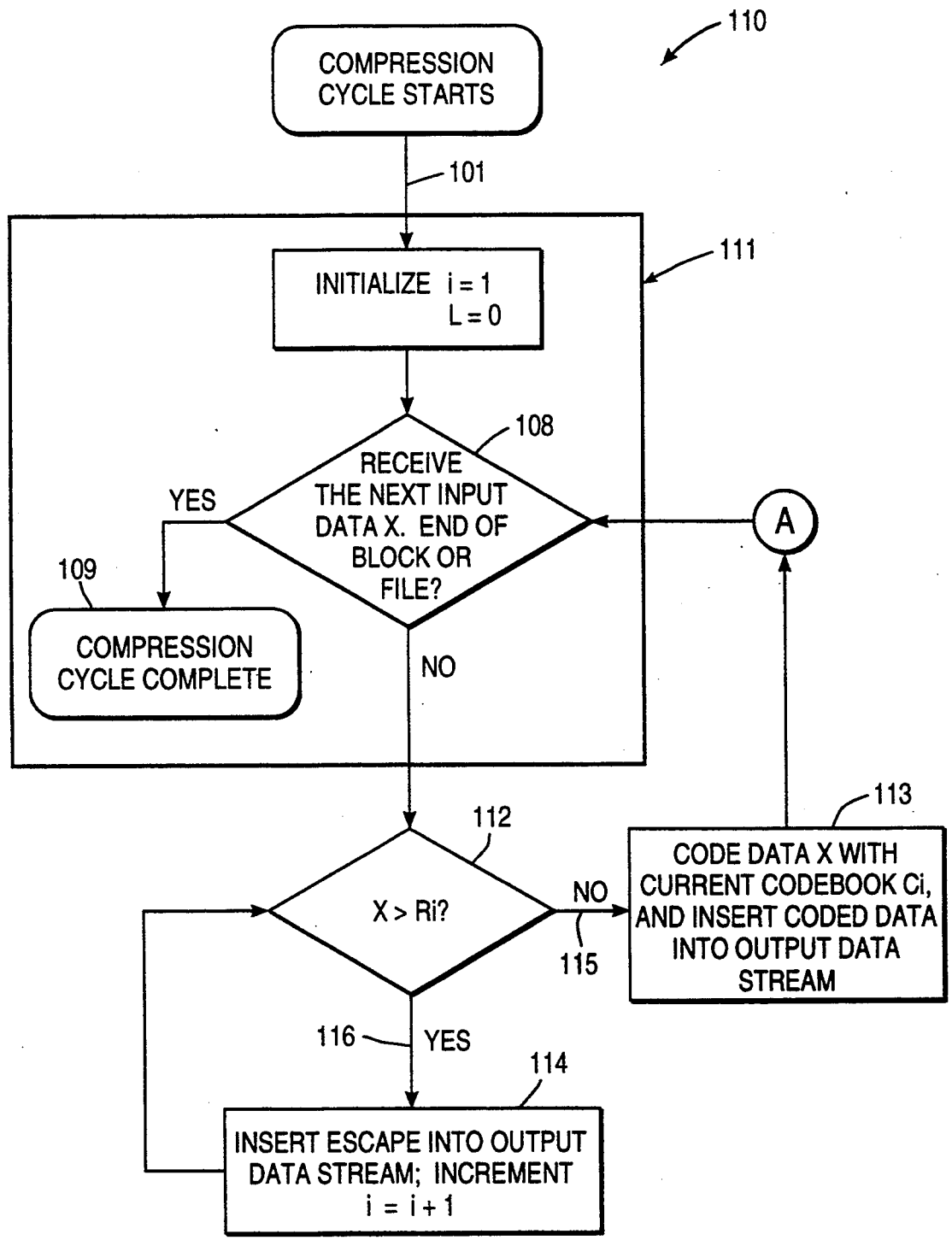
FIG. 5 illustrates a detailed block diagram of the coding process shown in FIG. 4.

FIG. 5 illustrates a more detailed embodiment of coding process 110. For each block of data, coding process 110 compares each input data X in that block of data with a current coding maximum, $R_i$, from a set of coding maximums. Each coding maximum $K_i$ in the set of coding maximums corresponds to the coding range maximum of an associated codebook in the set of provided codebooks. It is envisioned as within the scope of the principles of this invention that the set of codebooks associated with the set of coding maximums to be either a set of fixed length type codebooks, such as shown in Table 1, or a set of variable length codebooks, such as shown in Table 2, or a combination of both fixed length type codebooks and variable length codebooks. It is also envisioned that the number n of codebooks provided in the set of codebooks is a parameter that can be selected according to the user's application or need, as is also with the desired coding range maximums of each codebook associated with the set of codebooks.

TABLE 1

| Codebooks $C_i$ (where n = 3) | Codeword Format | Number of Codewords in $C_i$ | Number of Bits per Codeword | Coding Range | Coding Maximum $R_i$ |
|---|---|---|---|---|---|
| C1 Codebook (3-Bit Fixed( | X X X | 8 | 3 | 0 ... 7 | R1 = 7 |
| C2 Codebook (4-Bit Fixed) | X X X X | 16 | 4 | 0 ... 15 | R2 = 15 |
| C3 Codebook (5-Bit Fixed) | X X X X X | 32 | 5 | 0 ... 31 | R3 = 31 |

Table 1 illustrates a set of three fixed length codebooks, C1, C2, and C3, with corresponding set of coding maximums, R1, R2, and R3, prioritized from the smallest coding maximum to the largest coding maximum. Correspondingly, codebook C1, having a 3 bits per codeword format, comprises the smallest coding range, with a coding maximum R1=7. Codebook C2, having a 4 bits per codeword format, comprises the next larger coding range in this set of codebooks, with a coding maximum R2=15. Codebook C3, having a 5 bits per codeword format, comprises the largest coding range in this set of codebooks, with a coding maximum R3=31.

Figure 8:
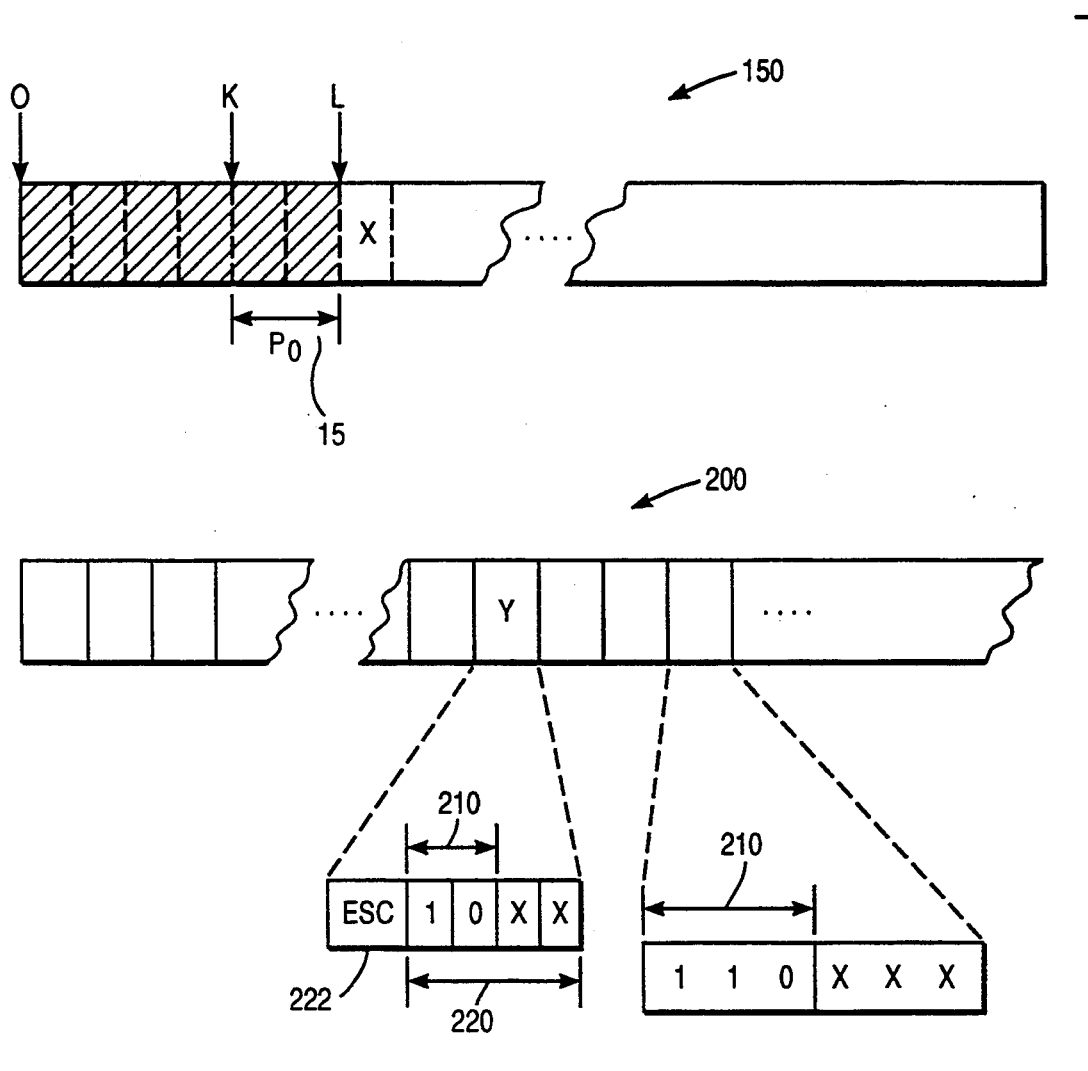
FIG. 8 illustrates an example of a format of an output coded data buffer produced by the coding process described in accordance with the principles of this invention.

To code a block of input data, coding process 100 in step 111 first initiates index i when current data pointer L is at the beginning of a block of input data 150, e.g., L=0 in input data block 150. (See FIG. 8 ). Current codebook $C_i$ is thus initiated to start with the smallest codebook C1 as the current codebook and current coding range maximum $R_i$ is also correspondingly initiated to R1. Coding process then checks to detect if input data X exceeds current coding maximum R1 associated with the current codebook C1. If input data X does not exceed current coding range maximum, e.g., input data is not greater than R1, then coding process in step 113 instructs the computer to continue coding input data with current codebook C1. Comparing the actual value of input data X to current coding range maximum R1, thus minimizes the codeword stored by avoiding unnecessarily using the next larger codebook in the set of codebooks, if input data X is actually small enough in value to be encoded by the then current codebook C1.

If, however, input data X exceeds the current coding range R1, then coding process 110 instructs the computer in step 114 to insert a codebook indicator, such as an ESCAPE code 222, into an output data stream 200 (FIG. 8 ) and increment index i to select the next larger codebook C2 as current codebook $C_i$ for encoding input data X. Current coding maximum $R_i$ is also thereby increased to the next larger coding maximum, R2. Current coding maximum R2 corresponds to the coding range maximum associated with current codebook C2. Thus, when coding process 110 returns to step 112 to repeat the step of comparing input data X to current coding maximum $R_i$, X is then compared to R2 to detect if X exceeds R2. Steps 112 and 114 are thus repeated until coding process 110 detects that input data X no longer exceeds current coding maximum $R_i$, Step 113 then codes input data X with the then corresponding current codebook Ci.

TABLE 2

| Codebooks Ci(j) | Codeword Format | Number of Codewords in Ci(j) | Number of Bits per Codeword | Coding Range | Coding Maximum Ri(j) |
|---|---|---|---|---|---|
| C1(j) Codebook (5-Bit Variable) | | | | | |
| C1(1) | 0 X X | 4 | 3 | 0 ... 3 | R1(1) = 3 |
| C1(2) | 1 0 X X | 4 | 4 | 4 ... 7 | R1(2) = 7 |
| C1(3) | 1 1 X X X | 8 | 5 | 8 ... 15 | R1(3) = 15 |
| C2(j) Codebook (7-Bit Variable) | | | | | |
| C2(1) | 0 X X | 4 | 3 | 0 ... 3 | R2(1) = 3 |
| C2(2) | 1 0 X X | 4 | 4 | 4 ... 7 | R2(2) = 7 |
| C2(3) | 1 1 0 X X X | 8 | 5 | 8 ... 15 | R2(3) = 15 |
| C2(4) | 1 1 1 1 X X X | 8 | 7 | 16 ... 23 | R2(4) = 23 |

Figure 6:
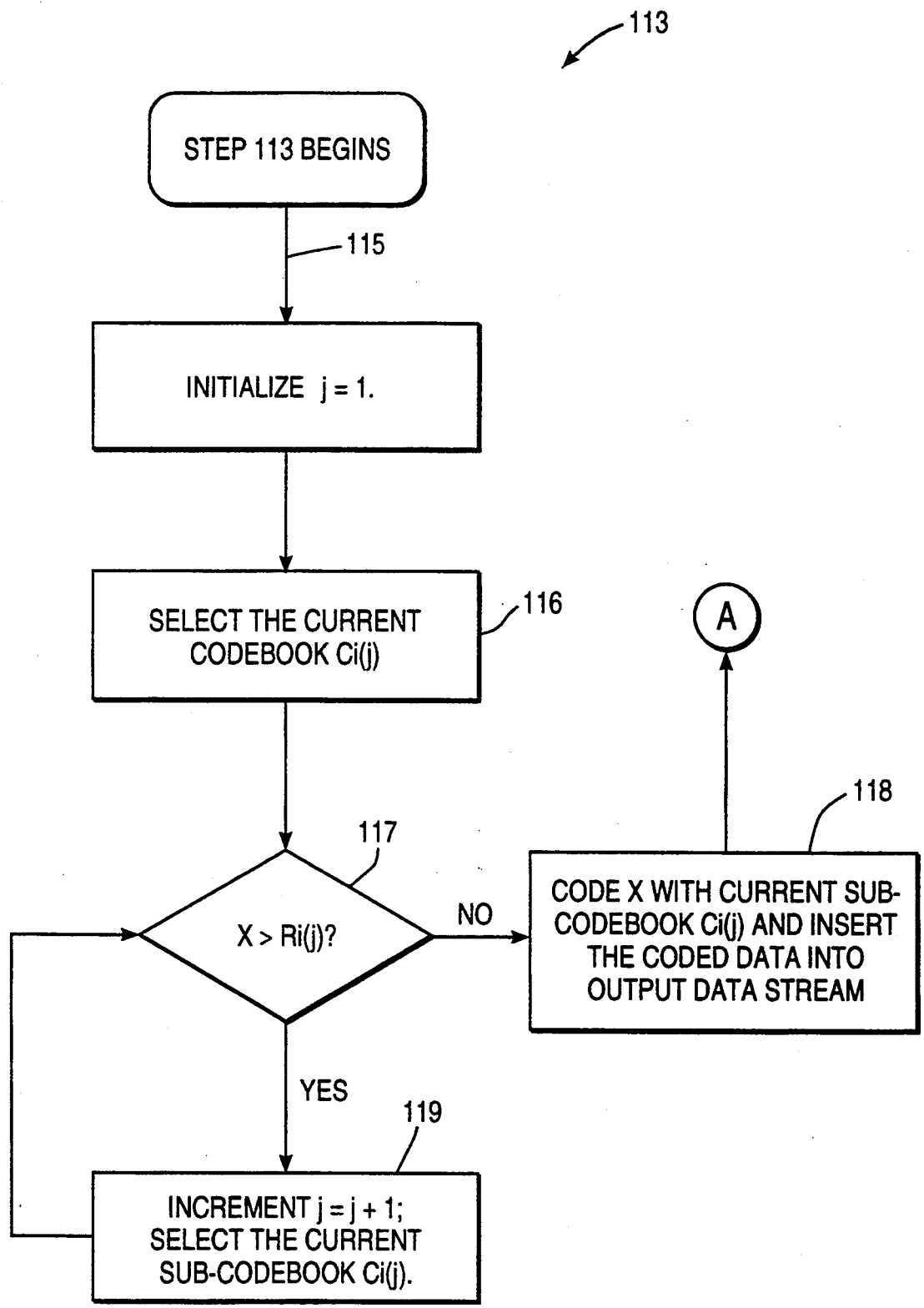
FIG. 6 illustrates an alternative embodiment of the coding process shown in FIG. 5.

FIG. 5 together with FIG. 6 illustrate an example of coding process 110 wherein the set of codebooks comprises a set of variable length codebooks, such as the set of variable length codebooks Ci(j) shown in Table 2. The coding steps with a set of variable length codebooks are similar to the coding steps with a set of fixed length codebooks as shown in FIG. 5. Coding process 110 first initializes index i in step 111 and then in step 112 detects whether input data X exceeds current coding maximum R1, associated with the then current codebook C1. If input data X does not exceed current coding maximum R1 then, in step 113, coding process 110 selects current codebook C1. Since C1 is a variable length codebook, coding step 113 as shown in FIG. 6 further comprises comparing input data X with a set of sub-coding maximums R1(j), where j ranges from 1 to n, with n equivalent to the maximum number of sub-codebooks C1(j) associated with current codebook C1. The set of current sub-codebook coding maximums R1(j) is also prioritized from the smallest coding maximum R1(1) to the largest coding maximum R1(3). Coding process 113 first initializes index j to select C1(1) and R1(1) and then continues processing input data X by comparing input data X to current sub-codebook coding maximums R1(1). In step 117, coding process detects whether input data X exceeds R1(1). If X is within the coding maximum of R1(1), e.g., X is less than 3, then X is encoded with sub-codebook C1(1) in step 118. If, however, X exceeds R1(1), e.g., X is greater than 3, then, in step 119, coding process increments index j to select the next larger coding maximum R1(2) as the current coding maximum R1(j) and returns to step 117 to compare X to this next larger current coding maximum R1(2) to detect whether X exceeds that next larger coding maximum. Step 117 is thus repeated until input data X is detected not to exceed R1(j), whereupon corresponding current sub-codebook C1(j) is then selected to code X in step 118, and coding process then returns to step 108 (FIG. 5).

Figure 7:
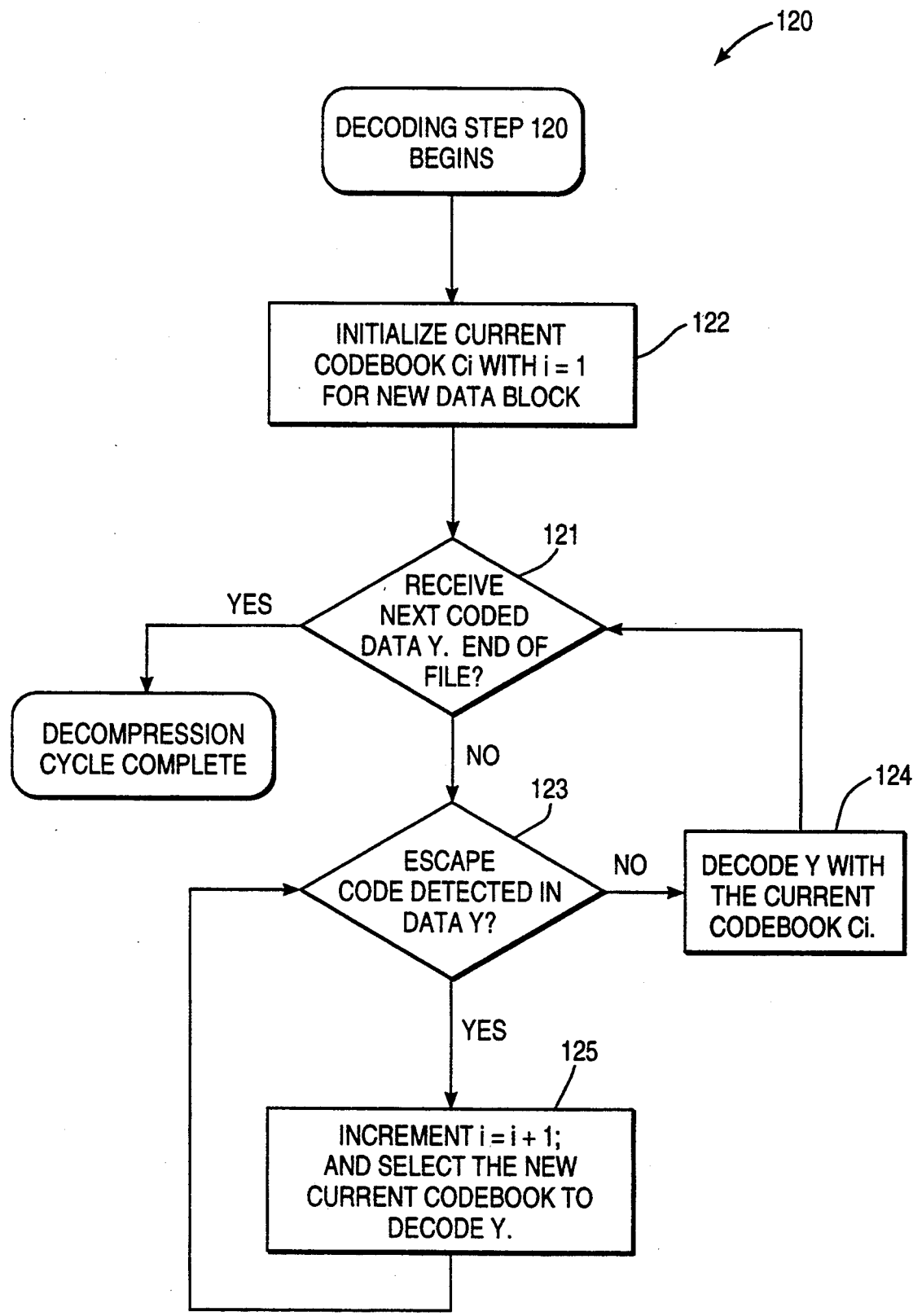
FIG. 7 illustrates a detailed block diagram of the decoding process shown in FIG. 4.

FIG. 7 illustrates a detailed embodiment of decoding process 120. Thus, when decoding process 120 detects the beginning of a new block of coded data Y, decoding process 120 initializes index i to select the smallest codebook C1 from a set of codebooks Ci in step 122, the set of codebooks Ci prioritized from the smallest codebook C1 to the largest codebook C3. Decoding process 120 then detects in step 123 whether each encoded data Y in that block of coded data 200 comprises one or more ESCAPE codes 222 prior to each codeword 220 (see FIG. 8). If no ESCAPE code 222 is detected before codeword 220, decoding step 124 instructs the computer to decode codeword 220 using current codebook C1.

If, however, an ESCAPE code is detected, decoding process 120 in step 125 then increments index i and selects the next larger codebook, C2, as current codebook Ci. Decoding process 120 then returns to step 123 to repeat of detecting for an ESCAPE code, and repeats the decoding process from step 123 until no further ESCAPE code is detected. Thus, for example, if two ESCAPE codes precede coded data Y, decoding process 120 first increments Ci to C2 in step 125 upon detecting the first ESCAPE code in step 123. Decoding process then returns to step 123 to repeat the step of detecting for another ESCAPE code. Upon detecting the second ESCAPE code, decoding process in step 125 selects the next larger codebook, C3, as current codebook Ci for decoding. When no further ESCAPE code is subsequently detected upon returning to step 123, decoding process 120 then decodes coded data Y with the then current codebook C3.

In an alternative embodiment, where the set of codebooks comprises a set of variable length codebooks, upon identifying current codebook Ci to decode coded data Y, decoding process 120 then selects an appropriate sub-codebook Ci(j) according to a prefix 210 associated with coded data Y. For example, referring to the set of variable length codebooks of Table 2, upon identifying C1 for decoding coded data Y, if prefix 210 comprises "0", then decoding process 120 selects Ci(1) to decode Y. If prefix "10" is detected as the first two bits of codeword 220, then C1(2) is selected to decode coded data Y.

The improved multiple-codebooks phase-in coding process described in accordance with the principles of this invention accommodates multiple codebooks having differing coding ranges. This process maximizes data compression by minimizing the number of bits required to represent each input data by using a smaller codebook where the input data to be coded is detected to be within the coding range of the smaller codebook. A larger codebook is "phased-in" only where the input data to be coded actually does exceed the coding range of a smaller codebook.

I claim:

1. A multi-codebook phase-in coding process for coding electronic data comprising the steps of:

receiving into a computer system one or more electronic input data to be encoded by the computer system; and wherein for each of the one or more electronic input data, the coding process comprises:

detecting if that input data exceeds a current coding maximum from a set of coding maximums, the set of coding maximums prioritized from the smallest coding maximum to the largest coding maximum;

selecting a codebook from a set of codebooks in response to the step of detecting if the input data is greater than the current coding maximum; and encoding that input data in accordance to the selected codebook to generate a coded output data.

2. A multi-codebook phase-in coding process of claim 1 further comprising a decoding process, the decoding process comprising the steps of:

receiving one or more electronic encoded input data; and wherein for each of the one or more encoded input data, the decoding process further comprises:

detecting whether one or more decode method indicators are associated with that encoded input data;

selecting a codebook for decoding from a set of prioritized codebooks in response to whether one or more decode method indicators are detected, the set of codebooks prioritized from the smallest codebook to the largest codebook; and decoding that encoded input data in accordance to the selected codebook to generate a decoded output data.

3. A multi-codebook phase-in coding process of claim 2 wherein the step of selecting a codebook for decoding further comprises:

wherein if no decode method indicator is detected, then selecting a current codebook to decode the encoded data; and wherein if one or more decode method indicators are detected, then for each decode method indicator detected, the decoding process further comprises:

selecting the next larger codebook from the set of prioritized codebooks as the current codebook and detecting for another decode method indicator;

repeating the step of selecting the next larger codebook as the current codebook and detecting for another decode method until no further decode method indicator follows; and decoding the encoded data with the selected current codebook method.

4. A multi-codebook phase-in coding process of claim 1, wherein if the input data exceeds the current coding maximum, the coding process further comprises inserting a corresponding codebook indicator into a generated coded output data stream to indicate a corresponding codebook to use to decode the encoded output data.

5. A multi-codebook phase-in coding process of claim 4 further comprising a decoding process, the decoding process comprising the steps of:

receiving one or more electronic encoded input data; and wherein for each of the one or more encoded input data, the decoding process further comprises:

detecting whether one or more decode method indicators are associated with that encoded input data;

selecting a codebook for decoding from a set of prioritized codebooks in response to whether one or more decode method indicators are detected, the set of codebooks prioritized from the smallest codebook to the largest codebook; and decoding that encoded input data in accordance to the selected codebook to generate a decoded output data.

6. A multi-codebook phase-in coding process of claim 5 wherein the step of selecting a codebook for decoding further comprises:

wherein if no decode method indicator is detected, then selecting a current codebook to decode the encoded data; and wherein if one or more decode method indicators are detected, then for each decode method indicator detected, the decoding process further comprises:

selecting the next larger codebook from the set of prioritized codebooks as the current codebook and detecting for another decode method indicator;

repeating the step of selecting the next larger codebook as the current codebook and detecting for another decode method until no further decode method indicator follows; and decoding the encoded data with the selected current codebook method.

7. A multi-codebook phase-in coding process of claim 1 wherein the step of selecting a codebook further comprises:

wherein if the input data exceeds the current coding maximum, then the coding process further comprises:

incrementing the current coding maximum to comprise the next larger coding maximum from the set of coding maximums and comparing the detected input data with the current coding maximum;

repeating the step of incrementing the current coding maximum and comparing the input data with the current coding maximum until the input data no longer exceeds the current coding maximum; and then selecting a current codebook associated with the current coding maximum to encode that input data; and wherein if the input data not exceed the current coding maximum, then selecting a current codebook associated with the current coding maximum to encode that input data.

8. A multi-codebook phase-in coding process of claim 7 further comprising a decoding process, the decoding process comprising the steps of:

receiving one or more electronic encoded input data; and wherein for each of the one or more encoded input data, the decoding process further comprises:

detecting whether one or more decode method indicators are associated with that encoded input data;

selecting a codebook for decoding from a set of prioritized codebooks in response to whether one or more decode method indicators are detected, the set of codebooks prioritized from the smallest codebook to the largest codebook; and decoding that encoded input data in accordance to the selected codebook to generate a decoded output data.

9. A multi-codebook phase-in coding process of claim 8 wherein the step of selecting a codebook for decoding further comprises:

wherein if no decode method indicator is detected, then selecting a current codebook to decode the encoded data; and wherein if one or more decode method indicators are detected, then for each decode method indicator detected, the decoding process further comprises:

selecting the next larger codebook from the set of prioritized codebooks as the current codebook and detecting for another decode method indicator;

repeating the step of selecting the next larger codebook as the current codebook and detecting for another decode method until no further decode method indicator follows; and decoding the encoded data with the selected current codebook method.

10. A multi-codebook phase-in coding process of claim 7, wherein if the input data exceeds the current coding maximum, the coding process further comprises inserting a corresponding codebook indicator into a generated coded output data stream to indicate a corresponding codebook to use to decode the encoded output data.

11. A multi-codebook phase-in coding process of claim 10 further comprising a decoding process, the decoding process comprising the steps of:

receiving one or more electronic encoded input data; and wherein for each of the one or more encoded input data, the decoding process further comprises:

detecting whether one or more decode method indicators are associated with that encoded input data;

selecting a codebook for decoding from a set of prioritized codebooks in response to whether one or more decode method indicators are detected, the set of codebooks prioritized from the smallest codebook to the largest codebook; and decoding that encoded input data in accordance to the selected codebook to generate a decoded output data.

12. A multi-codebook phase-in coding process of claim 11 wherein the step of selecting a codebook for decoding further comprises:

wherein if no decode method indicator is detected, then selecting a current codebook to decode the encoded data; and wherein if one or more decode method indicators are detected, then for each decode method indicator detected, the decoding process further comprises:

selecting the next larger codebook from the set of prioritized codebooks as the current codebook and detecting for another decode method indicator;

repeating the step of selecting the next larger codebook as the current codebook and detecting for another decode method until no further decode method indicator follows; and decoding the encoded data with the selected current codebook method.

13. A multi-codebook phase-in coding process for coding electronic data comprising the steps of:

receiving into a computer system one or more electronic input data to be encoded by the computer system; and wherein for each of the one or more electronic input data, the coding process further comprises:

initiating a current coding maximum to comprise the smallest coding maximum of a set of prioritized coding maximums, the set of coding maximums prioritized from the smallest coding maximum to the largest coding maximum;

comparing that input data to the current coding maximum, wherein if that input data does not exceed the current coding maximum associated with a current codebook, then selecting the current codebook to encoding that input data; and wherein if that input data exceeds the current codebook coding maximum, then the coding process further comprises:

incrementing the current coding maximum to the next larger current coding maximum in that set of prioritized coding maximums and then comparing the input data with the current coding maximum;

repeating the step of incrementing the current coding maximum and then comparing the input data to the current coding maximum until the input data does not exceed the current coding maximum; and selecting a current codebook associated with the current coding maximum to encode the input data; and encoding that input data in accordance to the codebook selected to generate a coded output data.

14. A multi-codebook phase-in coding process of claim 13 further comprising a decoding process, the decoding process comprising the steps of:

receiving one or more electronic encoded input data; and wherein for each of the one or more encoded input data, the decoding process further comprises:

detecting whether one or more decode method indicators are associated with that encoded input data;

selecting a codebook for decoding from a set of prioritized codebooks in response to whether one or more decode method indicators are detected, the set of codebooks prioritized from the smallest codebook to the largest codebook; and decoding that encoded input data in accordance to the selected codebook to generate a decoded output data.

15. A multi-codebook phase-in coding process of claim 14 wherein the step of selecting a codebook for decoding further comprises:

wherein if no decode method indicator is detected, then selecting a current codebook to decode the encoded data; and wherein if one or more decode method indicators are detected, then for each decode method indicator detected, the decoding process further comprises:

selecting the next larger codebook from the set of prioritized codebooks as the current codebook and detecting for another decode method indicator;

repeating the step of selecting the next larger codebook as the current codebook and detecting for another decode method until no further decode method indicator follows; and decoding the encoded data with the selected current codebook method.

16. A multi-codebook phase-in coding process of claim 13, wherein if the input data exceeds the current coding maximum, the coding process further comprises inserting a corresponding codebook indicator into a generated coded output data stream to indicate a corresponding codebook to use to decode the encoded output data.

17. A multi-codebook phase-in coding process of claim 16 further comprising a decoding process, the decoding process comprising the steps of:

receiving one or more electronic encoded input data; and wherein for each of the one or more encoded input data, the decoding process further comprises:

detecting whether one or more decode method indicators are associated with that encoded input data;

selecting a codebook for decoding from a set of prioritized codebooks in response to whether one or more decode method indicators are detected, the set of codebooks prioritized from the smallest codebook to the largest codebook; and decoding that encoded input data in accordance to the selected codebook to generate a decoded output data.

18. A multi-codebook phase-in coding process of claim 17 wherein the step of selecting a codebook for decoding further comprises:

wherein if no decode method indicator is detected, then selecting a current codebook to decode the encoded data; and wherein if one or more decode method indicators are detected, then for each decode method indicator detected, the decoding process further comprises:

selecting the next larger codebook from the set of prioritized codebooks as the current codebook and detecting for another decode method indicator;

repeating the step of selecting the next larger codebook as the current codebook and detecting for another decode method until no further decode method indicator follows; and decoding the encoded data with the selected current codebook method.

* * * * *